United States Patent
Chen et al.

(10) Patent No.: US 8,002,901 B1
(45) Date of Patent: Aug. 23, 2011

(54) TEMPERATURE DEPENDENT PULL SPEEDS FOR DRYING OF A WET CLEANED WORKPIECE

(75) Inventors: Chaoyuan Chen, San Jose, CA (US); George Galluzi, San Jose, CA (US); John Cho, Pleasanton, CA (US)

(73) Assignee: WD Media, Inc., San Jose, CA (US)

( * ) Notice: Subject to any disclaimer, the term of this patent is extended or adjusted under 35 U.S.C. 154(b) by 296 days.

(21) Appl. No.: 12/354,677

(22) Filed: Jan. 15, 2009

(51) Int. Cl.
- *B08B 7/04* (2006.01)
- *B08B 3/04* (2006.01)
- *F26B 7/00* (2006.01)

(52) U.S. Cl. ............... 134/32; 134/18; 34/381; 34/486; 34/510; 34/511

(58) Field of Classification Search .............. 134/19, 134/30, 31, 32; 34/381, 486, 493, 510, 511
See application file for complete search history.

(56) References Cited

U.S. PATENT DOCUMENTS

| | | |
|---|---|---|
| 4,736,760 A | 4/1988 | Coberly et al. |
| 4,902,350 A | 2/1990 | Steck |
| 4,984,597 A | 1/1991 | McConnell et al. |
| 5,301,701 A | 4/1994 | Nafziger |
| 5,653,045 A | 8/1997 | Ferrell |
| 5,660,642 A | 8/1997 | Britten |
| 5,671,544 A | 9/1997 | Yokomizo et al. |
| 5,727,578 A | 3/1998 | Matthews |
| 5,776,259 A | 7/1998 | Ciari |
| 5,849,104 A | 12/1998 | Mohindra et al. |
| 5,985,041 A | 11/1999 | Florez |
| 6,027,574 A | 2/2000 | Fishkin et al. |
| 6,029,371 A | 2/2000 | Kamikawa et al. |
| 6,446,355 B1 | 9/2002 | Jones et al. |
| 6,615,510 B2 | 9/2003 | Jones et al. |
| 6,620,260 B2 | 9/2003 | Kumagai et al. |
| 6,625,901 B1 | 9/2003 | Mehmandoust et al. |
| 6,928,748 B2 | 8/2005 | Chen et al. |
| 6,955,516 B2 | 10/2005 | Achkire et al. |
| 7,252,098 B2 | 8/2007 | Fishkin et al. |
| 7,437,832 B2 | 10/2008 | Usui |
| 2003/0234029 A1 | 12/2003 | Bergman |
| 2005/0229426 A1 * | 10/2005 | Achkire et al. ............... 34/351 |
| 2007/0181159 A1 | 8/2007 | Ibe et al. |

FOREIGN PATENT DOCUMENTS

WO    2008056969 A1    5/2008

* cited by examiner

*Primary Examiner* — Michael Kornakov
*Assistant Examiner* — Natasha Campbell

(57) ABSTRACT

Drying of wet workpiece, such as a magnetic recording media, following a wet clean process where the wet workpiece is displaced from a liquid volume into a gaseous volume at a pull speed that is dependent on the temperature of the gaseous volume.

18 Claims, 7 Drawing Sheets

| Chamber Temp (C) | Max Pull Rate (mm/s) |
|---|---|
| <40 C | 0.5 |
| 40-45 C | 0.6 |
| 45-50 | 0.7 |
| 50-55 | 0.8 |
| 55-60 | 0.9 |
| >60 | 1.0 |

TEMPERATURE DEPENDENT PULL SPEED LU TABLE
601

| Chamber Temp (C) | Zone 1 Pull Rate (mm/s) | Zone 2 Pull Rate (mm/s) | Zone 3 Pull Rate (mm/s) | Zone N Pull Rate (mm/s) |
|---|---|---|---|---|
| <40 C | 0.5 | 0.8 | 0.3 | Rate 1 |
| 40-45 C | 0.6 | 0.9 | 0.4 | Rate 2 |
| 45-50 | 0.7 | 1.0 | 0.5 | Rate 3 |
| 50-55 | 0.8 | 1.1 | 0.6 | Rate 4 |
| 55-60 | 0.9 | 1.3 | 0.7 | Rate 5 |
| >60 | 1.0 | 1.3 | 0.8 | Rate 6 |

TEMPERATURE DEPENDENT PULL SPEED LU TABLE
605

FIG. 6

TEMPERATURE DEPENDENT PULL SPEEDS FOR DRYING OF A WET CLEANED WORKPIECE

TECHNICAL FIELD

This invention relates to the field of wet cleaning of a workpiece and more specifically, to drying of wet magnetic recording media following a wet clean process.

BACKGROUND

Wet cleaning is a frequent and critical operation in the manufacture of a workpiece, such as a magnetic recording media, semiconductor wafer or LCD panel. Wet cleaning generally entails introducing a liquid, aqueous or otherwise, to the surface of the workpiece. Both throughput and cleaning efficiency of a wet clean are important considerations because throughput determines equipment cost/workpiece, which should be minimized while cleaning efficiency determines workpiece yield, which should be maximized.

Wet cleaning generally also entails drying the workpiece. Typically, a drying operation is performed by first submerging the workpiece in a volume of liquid, such as deionized ultrapure water, and then displacing the workpiece from the liquid volume to a gaseous volume to dry the liquid from the surface of the workpiece. FIG. 1 illustrates a plan view of a magnetic recording media substrate 130 which has been wet cleaned and dried in such a manner during a media fabrication process. A residue stain 131 is depicted on the magnetic recording media substrate 130. Such stains are frequently caused by improper drying which may occur for example when the workpiece is pulled, or withdrawn, from the liquid during the drying operation and the liquid meniscus at the liquid interface breaks poorly and leaves behind a residue.

While it is known that such residue stains are detrimental to workpiece yield, throughput of a dryer can suffer greatly if the pull speed of the workpiece is reduced significantly to reduce ripples in the liquid interface or to otherwise improve other undesirable meniscus behavior in an effort to mitigate yield loss from residue staining. For example, a mere 20 second increase in the dryer process time can translate into a 200 parts/hour throughput reduction.

BRIEF DESCRIPTION OF THE DRAWINGS

The present invention is illustrated by way of example, and not limitation, in the figures of the accompanying drawings in which:

FIG. 6 illustrates temperature dependent pull speed lookup tables, in accordance with embodiments.

DETAILED DESCRIPTION

In the following description, numerous specific details are set forth such as examples of specific, components, processes, etc. to provide a thorough understanding of various embodiment of the present invention. It will be apparent, however, to one skilled in the art that these specific details need not be employed to practice various embodiments of the present invention. For example, while the exemplary embodiments pertains to drying of magnetic recording media, the methods described herein may be readily applied to processing of another workpiece, such as semiconductor substrates or LCD panels. In other instances, well known components or methods have not been described in detail to avoid unnecessarily obscuring various embodiments of the present invention.

Figure 1:
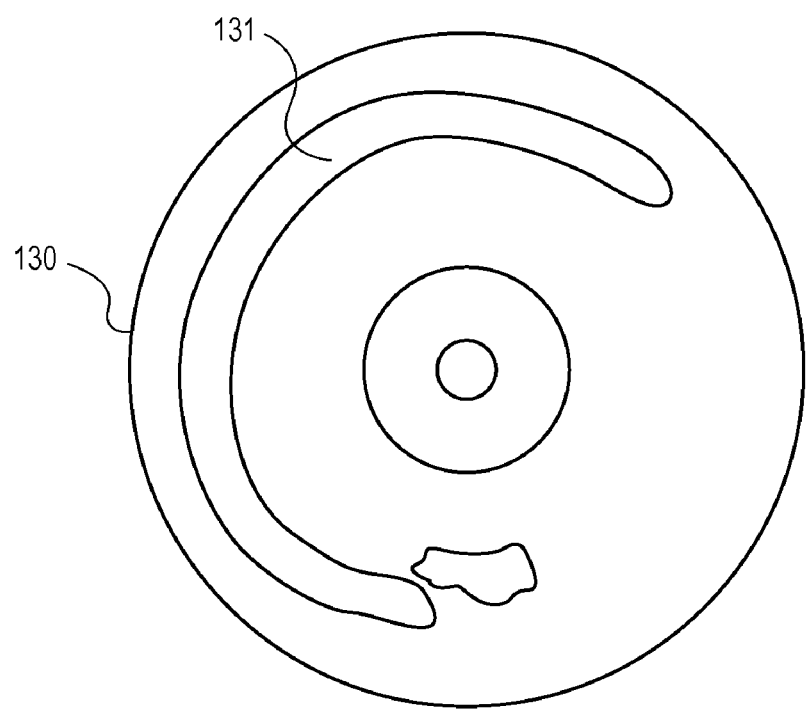
FIG. 1 illustrates a plan view of an annular disk-shaped magnetic recording media which has been wet cleaned and dried in a conventional manner during a media fabrication process.
Figure 2A:
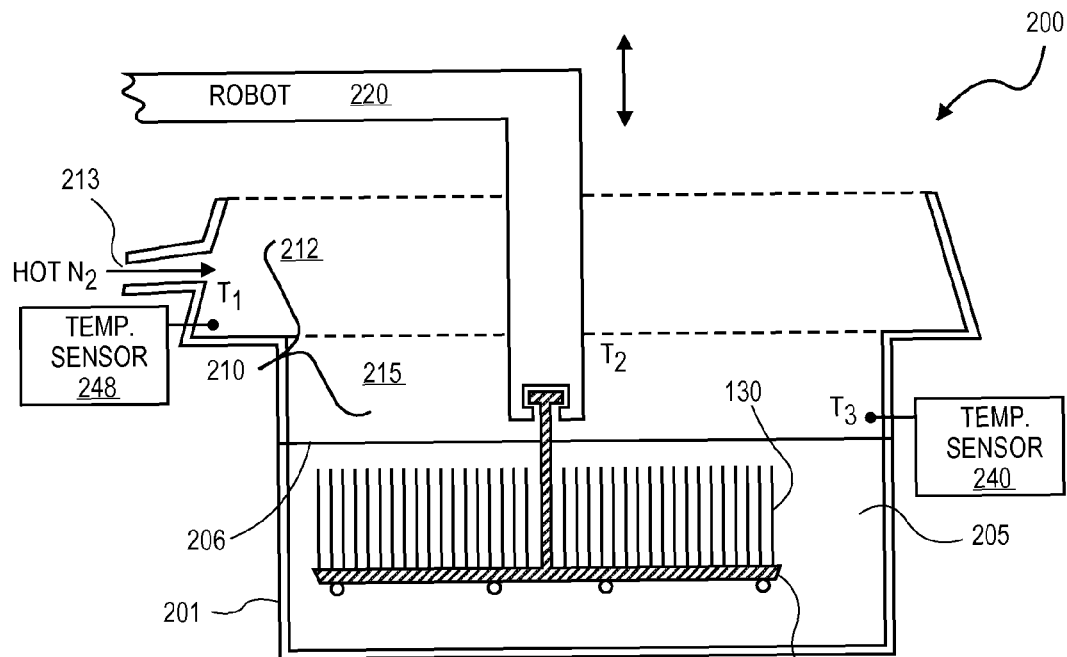
FIGS. 2A and 2B are each cross-sectional views, orthogonal to each other, illustrating a dryer module of a wet clean station, in accordance with an embodiment.
Figure 2B:
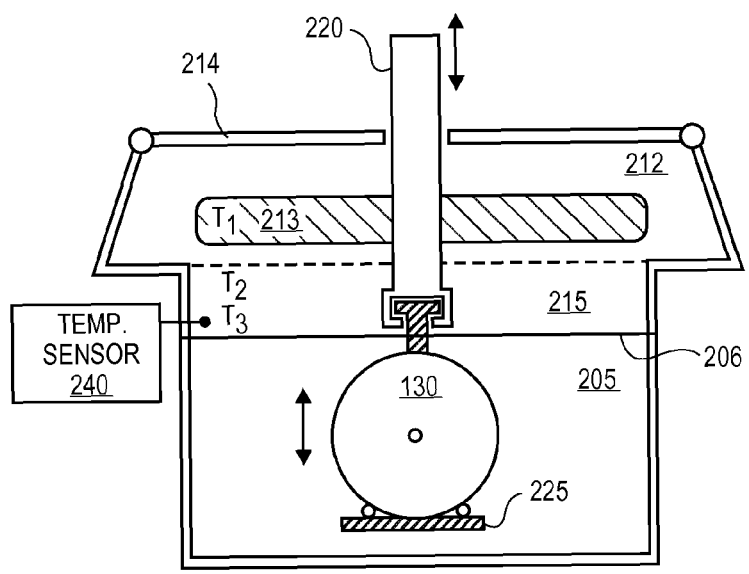

FIGS. 2A and 2B are orthogonal cross-sectional views illustrating an exemplary dryer module 200, which may be one module of an automated wet station (AWS) or a stand-alone apparatus. A dryer module such as that depicted in FIGS. 2A and 2B is commercially available through Invenpro, (M) Sdn. Bhd. of Malaysia. However, particular embodiments describe herein may nonetheless be practiced with any other commercially available dryer modules which have capabilities similar to those describe herein. As depicted, the dryer module 200 includes a tank 201 containing a liquid volume 205. Over the liquid volume 205 is a gaseous volume 210 which further includes a dryer hood 212 and a dryer chamber 215. The dryer hood 212 encloses a high temperature region to rapidly dry the disk while the gaseous volume within the dryer chamber 215 serves as a buffer region between the dryer hood 212 and liquid volume 205 to ensure the gas introduced into the dryer hood 212 does not perturb the liquid-gaseous interface 206.

During operation of the dryer module 200, hood doors 214 open and close to permit transport of a shuttle 225 carrying at least one workpiece, such as a magnetic recording media substrate 130, to and from the dryer module 200 by a robot handler 220. For example, when the magnetic recording media substrate 130 is transported to the dryer module 200, the hood doors 214 open, the magnetic recording media substrate 130 is submerged in the liquid volume 205 so that all surfaces of the magnetic recording media substrate 130 are below the liquid-gaseous interface 206, and the hood doors 214 close. For better drying efficiency, the gaseous volume within the dryer hood 212 is heated to a controlled setpoint by introducing a gas, such as nitrogen ($N_2$), heated to approximately 80-125° C. Heating of the inlet gas may be controlled based on feedback from a hood temperature sensor 248.

The dryer module 200 further includes a temperature sensor 240 positioned proximate to the liquid-gaseous interface 206 for determining the temperature of the dryer chamber 215. In a specific embodiment, the temperature sensor 240 is positioned within approximately 50 mm of the liquid-gaseous interface 206 and preferably within approximately 25 mm. As discussed in further detail elsewhere herein, the temperature sensor 240 may be utilized for control of the speed at which the magnetic recording media substrate 130 is pulled from the liquid volume 205 into the gaseous volume 210, and in particular the dryer chamber 215, during the drying operation. Controlling the pull speed in this temperature dependent manner enables the drying efficiency to be improved so that workpiece staining and/or total drying time may be shortened, thereby improving dryer throughput. As further discussed herein, the pull speed may be made dependent both the geometry of the workpiece and on the temperature of the dryer to control meniscus behavior and improve drying efficiency.

In an embodiment, the speed at which a workpiece is displaced out of a liquid is dependent on the geometry of the workpiece. The geometry of the workpiece determines the surface topologies which pass through the liquid-gaseous interface 206 forming a meniscus. Generally, the interface meniscus is stronger at higher pull speeds and therefore the pull speed may be relatively lower in zones where the workpiece surface breaks the meniscus.

Figure 3:
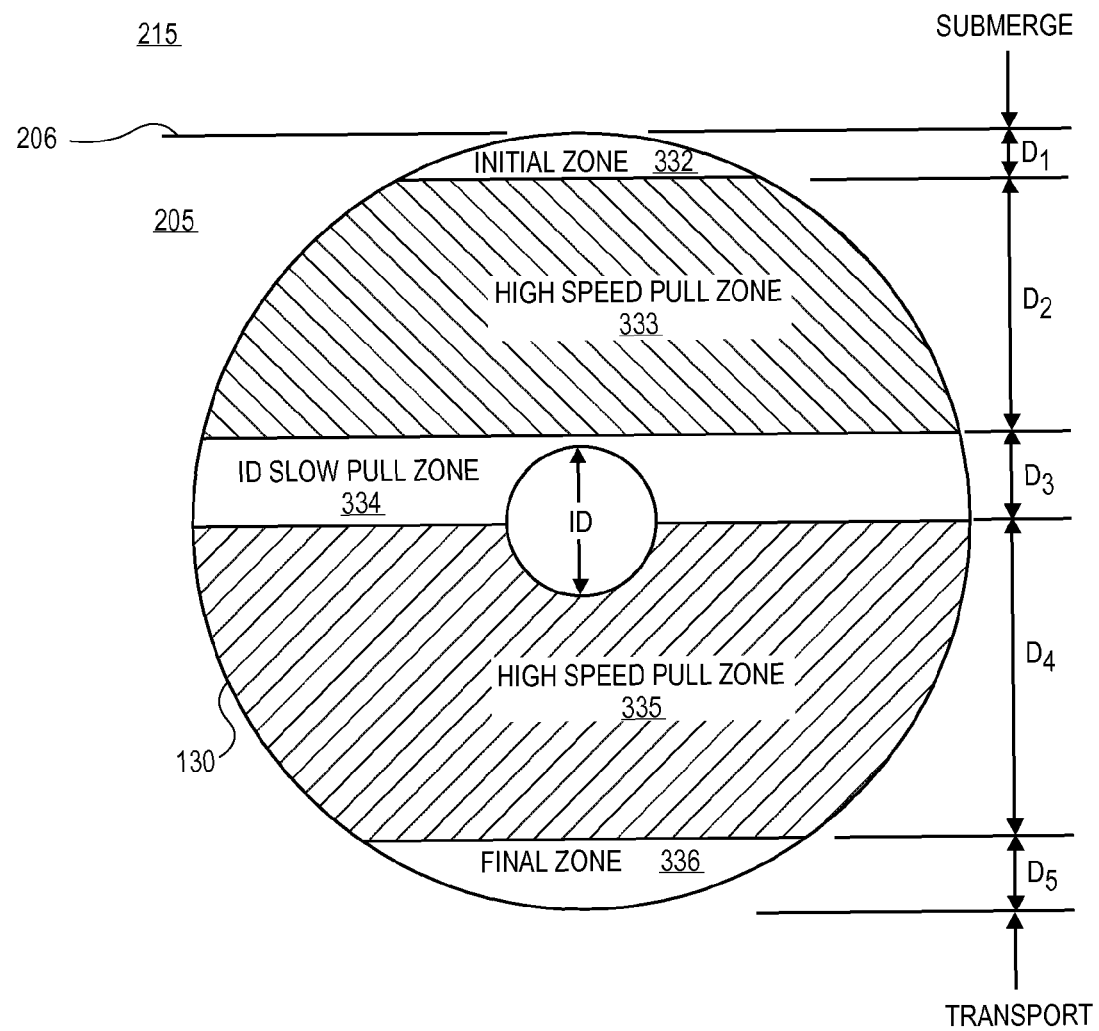
FIG. 3 is a graph illustrating dryer chamber temperature dependence upon dryer process time and hood door position.

FIG. 3 is an expanded side view of FIG. 2B, depicting the magnetic recording media substrate 130 standing upright within a liquid volume 205. The magnetic recording media substrate 130 has an annular disk-shape. In particular embodiments, the outer diameter (OD) varies between approximately 48 mm to 95 mm while the inner diameter (ID) ranges from approximately 20 mm to 25 mm. However, other dimensions are also possible, depending on the application of the magnetic recording media.

In an embodiment where the drying operation is performed as part of a post-sputter wet cleaning (PSC) module, the magnetic recording media substrate 130 includes a magnetic recording layer on the surface of the disk. The magnetic layer may be of any known composition, such as a cobalt (Co) alloy. The magnetic layer may be formed on both sides of magnetic recording media substrate 130 to form a double-sided magnetic recording disk. Alternatively, a single sided perpendicular magnetic recording disk may be formed. In an alternate embodiment where the drying operation is performed as part of a pre-sputter wet cleaning, the magnetic recording media substrate 130 may be, for example, a glass material, a metal, and/or a metal alloy material. Glass substrates that may be used include, for example, silica containing glass such as borosilicate glass and aluminosilicate glass. Metal and metal alloy substrates that may be used include, for example, aluminum (Al) and aluminum magnesium (AlMg) substrates, respectively. The magnetic recording media substrate 130 may also be plated with a nickel phosphorous (NiP) layer.

During a drying operation, workpiece zones 332, 333, 334, 335 and 336 pass through the liquid-gaseous interface 206 as a robot handler traverses the displacement distances D1, D2, D3, D4 and D5, respectively. In particular embodiments, the pull speed of the robot handler depends on positional teach points to define the displacement distances D1-D5 and thereby account for the geometry of magnetic recording media substrate 130. Thus, workpiece zones 332-336 form a pull speed profile across the major surfaces of the magnetic recording media substrate 130. As shown, the initial zone 332 includes a top OD surface of the magnetic recording media substrate 130. It has been found that a relatively lower pull speed for the initial zone 332 is advantageous. Too high of a pull speed in the initial zone 332 has been correlated with severe staining near the top of the magnetic recording media substrate 130. The meniscus is broken along the displacement distance D1 as the initial zone 332 passes through the liquid-gaseous interface 206. The displacement distance D1 may be between 1 and 10 mm, depending on the substrate OD and ID and is preferably between 4 and 6 mm for a substrate having a 95 mm OD and a 25 mm ID.

The pull speed may then be increased to a first intermediate pull speed for the displacement distance D2, which may be between 10 mm and 40 mm, depending on the substrate OD and ID and is preferably between 20 mm and 30 mm for a substrate having a 95 mm OD and a 25 mm ID. The high speed pull zone 333 passes through the liquid-gaseous interface 206 at this first intermediate pull speed. Increasing the pull speed above that used for the initial zone 332 shortens drying time, advantageously increasing dryer throughput. In one embodiment, the first intermediate pull speed may be approximately 1.7 mm/s.

The first intermediate pull speed may then be reduced to a second intermediate pull speed upon reaching the ID slow pull zone 334 where the meniscus is again broken by the ID surface of the magnetic recording media substrate 130. The transition between the first intermediate pull speed and the second intermediate pull speed occurs upon the ID surface being submerged approximately 1-5 mm below the liquid-gaseous interface 206, with the displacement distance D2 to be maximized and displacement distance D1 minimized for highest throughput. Generally, the ID slow pull zone 334 extends to approximately one half of the ID. For an exemplary 25 mm ID, the displacement distance D3 is between 15 mm and 20 mm. In one exemplary embodiment, the second intermediate pull speed is approximately 0.7 mm/s.

After the ID slow pull zone 334 has passed through the liquid-gaseous interface 206, the pull speed is then increased to a third intermediate pull speed along the displacement distance D4 where the high speed pull zone 335 passes through the liquid-gaseous interface 206. The higher third intermediate pull speed further improves the dryer throughput and in an advantageous embodiment, the third intermediate pull speed is greater than first intermediate pull speed. The displacement distance D4 again depends on the substrate OD and ID and is preferably between 20 mm and 30 mm for a substrate having a 95 mm OD and a 25 mm ID. In one exemplary embodiment, the third intermediate pull speed is approximately 1.7 mm/s.

The pull speed is then reduced from the third intermediate pull speed to a final pull speed as the final zone 336, including the bottom OD surface of the magnetic recording media substrate 130, passes through the liquid-gaseous interface 206 over the displacement distance D5. The displacement distance D5 depends on the substrate OD and ID and is preferably between 5 mm and 10 mm for a substrate having a 95 mm OD and a 25 mm ID. In one exemplary embodiment, the final pull speed is approximately 0.7 mm/s. Thus, in the exemplary pull speed profile depicted in FIG. 3, pull speed depends on the workpiece geometry such that the pull speed is a non-linear function of the displacement of the workpiece.

The temperature of the gaseous volume within the dryer chamber 215 increases by convective heat transfer such that a considerable temperature delta may exist between the dryer hood 212 and dryer chamber 215. For example, the highest temperature T1 is in the dryer hood proximate to the gas inlet 213 with a lowest temperature T3, in the chamber proximate to the liquid-gaseous interface 206 at the distal end of tank, furthest from the gas inlet 213. An intermediate temperature T2 may be found in a region of the gaseous volume there between. Through experimentation, it has been found that the temperature of the gaseous volume in the dryer chamber 215, particularly the temperature proximate to the liquid-gaseous interface, has a large impact on at least some of the mechanisms responsible for the staining of a workpiece during a drying operation. Generally, with lower chamber temperatures, the pull speed must be lowered to reduce staining.

Figure 4:
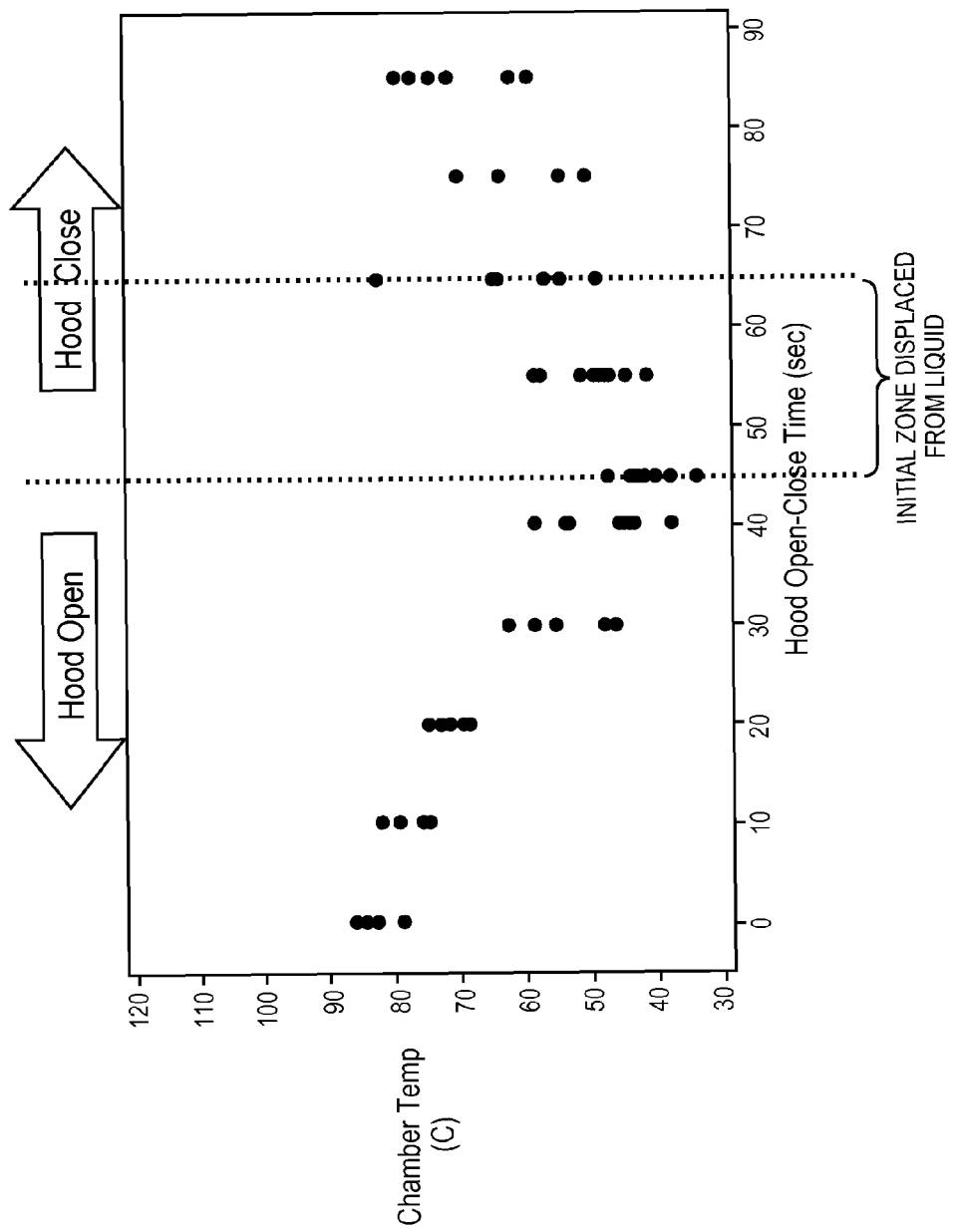
FIG. 4 is a plan view of an annular disk-shaped magnetic recording media illustrating workpiece zones upon which pull speed depends, in accordance with an embodiment.

FIG. 4 is a graph illustrating dryer chamber temperature dependence upon time and hood door position during a drying cycle. As depicted, the temperature in the dryer chamber 215 (e.g., as measured by the temperature sensor 240) declines by approximately 40° C. from the time the hood door 214 opens at the 0 second time mark until the hood door 214 is closed, at approximately the 45 second time mark, as dryer heat dissipates to the relatively colder air entering the opened door. During the 45 second time interval that the hood door 214 is open, the robot handler 220 transports the magnetic recording media substrate 130 through the dryer hood 212 and dryer chamber 215 and submerges the media in the liquid volume 205.

After the hood door 214 is closed and the media is submerged, the heated $N_2$ is then introduced into the dryer hood 212. Although the temperature in the dryer hood 212 jumps immediately upon closing the hood doors 214, the chamber temperature does not. Instead, the temperature within the dryer chamber 215 increases by approximately 30° C. from the 45 second time mark to the 85 second time mark. Notably, in addition to the long transition time there is significant variation (e.g., 15 to 20° C.) across multiple runs processing substantially the same workpiece batch size.

Generally, to increase dryer throughput the pull speed may be increased and the hood drying time reduced. However in so doing, the drying which occurs as the workpiece zones pass through the dryer chamber 215 becomes more important to the overall drying efficiency. However, as shown in FIG. 4 the temperature within the dryer chamber 215 may still be at a very low temperature (i.e., significantly below the hood temperature) so that drying efficiency within the dryer chamber 215 is poor.

Figure 5:
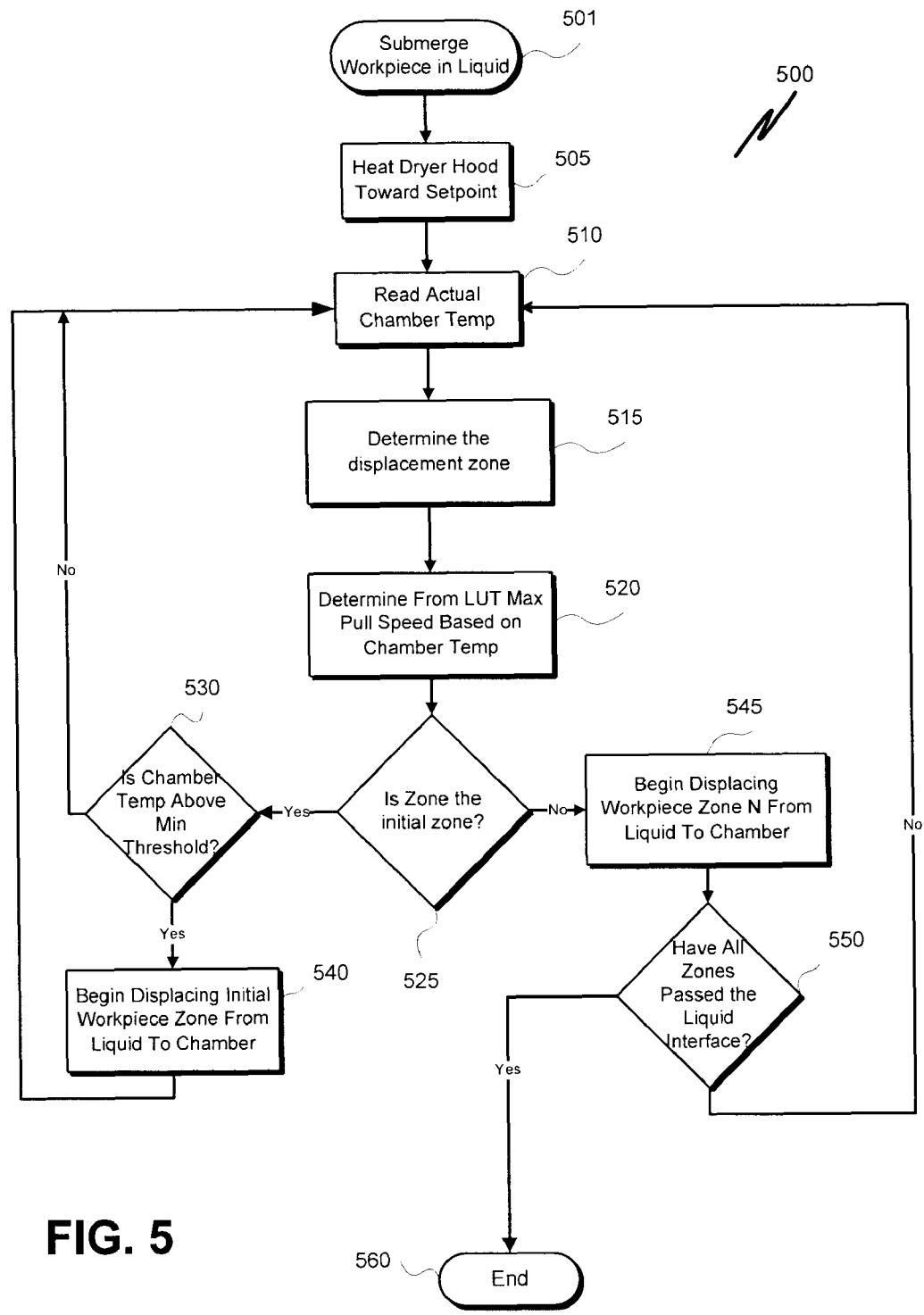
FIG. 5 is a flow diagram illustrating a method of displacing a workpiece from a liquid volume to gaseous volume, in accordance with an embodiment.

In an embodiment, to mitigate the effects of the lagging dryer chamber temperature while maximizing dryer throughput, the speed at which a workpiece is displaced out of a liquid and into a gaseous volume is determined based on the temperature of a gaseous volume within the dryer. FIG. 5 is a flow diagram illustrating a workpiece pulling method 500 in which a workpiece is displaced from a liquid volume to gaseous volume at a pull speed that is dependent on the temperature of the dryer chamber 215. In one such embodiment, the pull speed is set by an automated control system executing the workpiece pulling method 500.

For clarity, the workpiece pulling method 500 is described with reference to the dryer module 200 depicted in FIG. 2A and FIG. 2B. The workpiece pulling method 500 begins at operation 501 with submerging the workpiece in a liquid volume. At operation 505, with the dryer hood doors 214 closed, the dryer hood 212 is heated toward setpoint, convectively heating the dryer chamber 215. At operation 510, the actual temperature of the dryer chamber 215 is measured, for example with the temperature sensor 240. In one such embodiment, the heating of the dryer hood 212 and sensing of the temperature in the dryer chamber 215 is initiated once the magnetic recording media substrate 130 is submerged in the liquid volume 205. During operation 510, the chamber temperature may be sensed at any nominal sampling rate, for example one measurement/second.

At operation 515 the workpiece zone is determined, for example based on the position of the robot handler 220. At operation 520, a lookup table (LUT) is accessed to determine a pull speed based on the sensed chamber temperature. Exemplary LUT are depicted in FIG. 6. In one embodiment illustrated in FIG. 6, a temperature dependent pull speed LUT 601 includes an array of chamber temperatures, each associated with a maximum pull speed. As depicted, the maximum pull speed decreases with lower chamber temperature. It should be noted however, that the actual values populating the LUT 601 are merely exemplary and the pull speed dependency on chamber temperature may be either a linear or non-linear.

Referring back to FIG. 5, the maximum pull speed determined at operation 520 may then be scaled based on the workpiece zone being displaced through the liquid-gaseous interface. In this manner, the pull speed is made both a function of the chamber temperature and a function of the geometry of the workpiece. In an alternate embodiment, the temperature dependent pull speed LUT 605 may be accessed at operation 520. As depicted in FIG. 6, the temperature dependent pull speed LUT 605 includes an array of chamber temperatures and an associated pull speed for each of a number of workpiece zones. The actual values of populating the LUT 605 are merely exemplary. In such an embodiment, a specific pull speed based on both the chamber temperature and the workpiece zone may be determined directly at operation 520 and a secondary scaling of a maximum pull speed is unnecessary.

The workpiece pulling method 500 diverges at operation 525 to allow for a chamber temperature ramp delay if the pull from the liquid has not yet begun. As depicted in FIG. 4, waiting 20 seconds before displacing the initial workpiece zone (e.g., zone 332 in FIG. 3) permits the chamber temperature to increase approximately 15 to 20° C. The higher chamber drying efficiency at the elevated temperature then enables a faster pull speed and potentially a shorter hood drying time. Such a chamber temperature ramp delay entails a later drying start time for the benefit of the greater drying efficiency possible with a higher temperature drying chamber.

Returning to FIG. 5, if the chamber temperature is determined to be below a minimum temperature threshold at operation 530, then the workpiece pulling method 500 returns to operation 510 to again read the actual temperature, thereby delaying a pull of the workpiece from the liquid volume 205 for each iteration of operations 510-530 by at least the temperature sample rate until the chamber temperature increases. For example, where operation 510 is performed at a sample rate of approximately one sample/sec, the delay period will be a multiple of the one sample/sec rate. If the chamber temperature is determined to be at or above a minimum temperature threshold at operation 530, the pull is immediately initiated at operation 540 to displace the initial zone from the liquid volume 205 at the initial pull speed as determined operation 515. In alternate embodiments, where a temperature ramp delay is avoided, the operation 530 is eliminated and, at operation 540, the initial pull commences immediately at a speed based on chamber temperature.

Following operation 540, the workpiece pulling method 500 returns to operation 510 to again read the chamber temperature, determine the workpiece zone at operation 515 and determine a new pull speed based on the temperature at operation 520. Because the dryer chamber 215 becomes warmer with time and the workpiece zone has incremented into an intermediate zone, the pull speed determined this time at operation 520 may be considerably higher than it was for the initial workpiece zone.

The workpiece pulling method 500 then continues to operation 525, and because the pull has been initiated, the workpiece pulling method 500 proceeds this time to operation 545 to begin displacing the next zone (N) from the liquid volume 205 to the gaseous volume (e.g., within dryer chamber 215). The workpiece pulling method 500 then continues to operation 550, at which point the method diverges. If all workpiece zones have been pulled through the liquid-gaseous interface 206, the workpiece pulling method 500 completes at operation 560 and the workpiece may then be completely dried within the dryer hood 212. If not all workpiece zones have been pulled through the liquid-gaseous interface 206, the workpiece pulling method 500 repeats the cycle by returning to operation 510 for another chamber temperature sample and another iteration of the operations 515, 520, 525, 545 and 550.

Depending on the time required to pull a particular zone through the liquid-gaseous interface 206, the rate at which the chamber temperature increases and the granularity of the temperature dependent pull speed LUT, the pull speed for any particular zone may be updated multiple times as the workpiece is displaced through the zone. For example, referring back to FIG. 3, the first pull speed of approximately 0.7 mm/s for the high speed pull zone 333 may be modified to be approximately 0.8 mm/s upon a second temperature determination.

The workpiece pulling method 500 may be looped in this manner continuously such that the pull speed for each workpiece zone may be maximized as a function of both zone and chamber temperature. The pull speeds in the specific geometrically-based workpiece zones depicted in FIG. 3 may be adapted to additionally depend on chamber temperature for increased throughput and reduced staining. For example, in one particular embodiment where the exemplary workpiece pulling method 500 is applied to the magnetic recording media substrate 130, the initial pull speed and first intermediate pull speed are each set based on the temperature of a gaseous volume. For example, over the initial zone 332, the pull speed may be reduced to approximately 0.75+/−0.25 mm/s, depending on the dryer chamber temperature. Such a low, temperature dependent, pull speed will achieve mush less residual liquid staining on the side of the magnetic recording media substrate 130, near the top surface. The slower initial pull speed would improve the drying efficiency of the relatively cooler dryer chamber because the poor meniscus behavior is reduced or eliminated by the slower pull speed. Additionally, the total pull duration is not increased greatly because the displacement distance D1 is small and the pull speed temperature dependence accounts for the significant run-to-run variation in the chamber temperature.

In a further embodiment, to minimize total pull duration, the pull speed for certain workpiece zones is modified to compensate for a relatively slower pull speed in other workpiece zones dictated by the lower dryer temperature. In this manner, the pull speed in a second workpiece zone is made dependent on the pull speed of a first workpiece zone. For example, where the pull speed in a first workpiece zone is temperature dependent and performed at a rate relatively lower than a nominal value, the pull speed in a second workpiece zone, which may not be temperature dependent (e.g., one of the intermediate zones, such as high speed pull zones 333 or 335), is increased to compensate (based on displacement distance and pull rate) toward a nominal total pull duration.

In another embodiment however, the pull speed at each of the five depicted workpiece zones 332-336 is determined based on the dryer chamber temperature. Such an embodiment incurs little additional implementation overhead and additional throughput gains may be achieved by increasing the pull speed in other workpiece zones. For example, the third intermediate pull speed, at which the high speed pull zone 335 passes through the liquid-gaseous interface 206, may be increased to approximately 1.75-2.0 mm/s based on the measured chamber temperature.

In certain embodiments, the final pull speed (e.g., displacing final zone 336 through the liquid-gaseous interface 206) is set to be higher than the initial pull speed. For example, where the final pull speed for a 95 mm OD magnetic recording media substrate 130 is approximately 0.75 mm/s, the initial pull speed may vary as approximately 0.75+/−0.25 mm/s because the initial pull speed may be limited by both the lower chamber temperature and the meniscus issues pertaining to the top OD surface while the final pull speed is only limited by the meniscus issues pertaining to the bottom OD surface.

In a further embodiment, the final zone 336 including the bottom surface of the magnetic recording media substrate 130 passes through the liquid-gaseous interface 206 at a final pull speed that is faster than the second intermediate pull speed, at which the ID slow pull zone 334 passes through liquid-gaseous interface 206. For example, where the final pull speed for a 95 mm OD magnetic recording media substrate 130 is approximately 0.75 mm/s, the second intermediate pull speed is approximately 0.5 mm/s.

Figure 7:
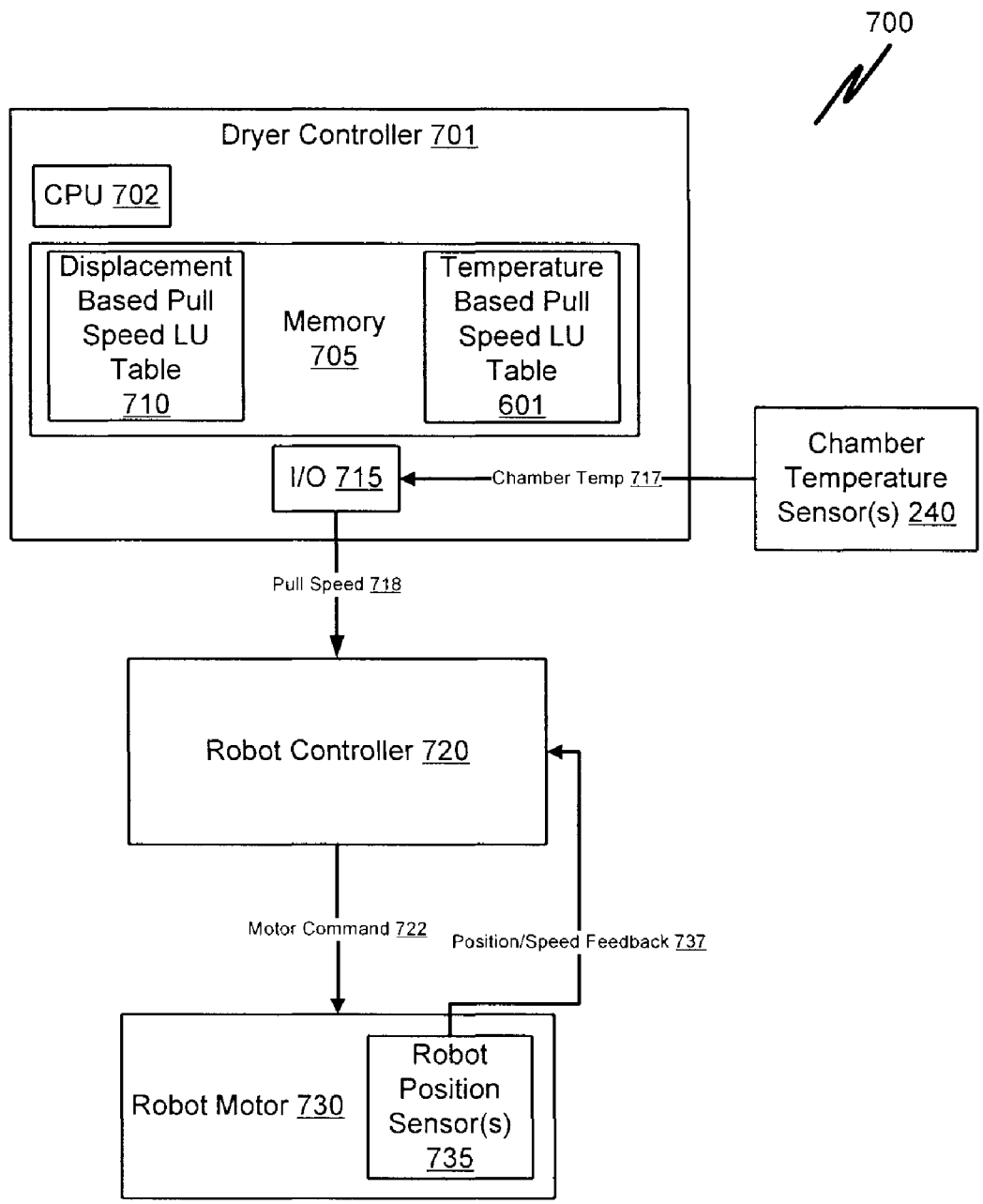
FIG. 7 is a block diagram illustrating a control system for displacing a workpiece from a liquid volume to gaseous volume based on temperature of the gaseous volume, in accordance with an embodiment.

FIG. 7 is a block diagram illustrating a dryer control system 700 for displacing a workpiece from a liquid volume to gaseous volume at a pull speed dependent on the temperature of the gaseous volume, in accordance with an exemplary embodiment. As depicted, a dryer controller 701, such as a programmable logic controller (PLC), includes a processor 702, a memory 705 and I/O 715. The dryer controller 701 is an automated control system responsible for controlling pulling of a workpiece from a liquid volume into a gaseous volume to dry the workpiece, such as that described in reference to FIG. 5. The memory 705 may be of any conventional type, such as non-volatile memory (flash, etc.). The memory 705 stores a temperature based pull speed LUT 601, as described elsewhere herein. In the exemplary embodiment, the memory 705 stores an additional displacement based pull speed LUT 710 including at least one robot positioning teach point associated with a particular nominal pull speed which may be used as a scaling factor for determining a temperature-based, zone-based pull speed.

As further depicted, the dryer control system includes a chamber temperature sensor 240 which is coupled to the dryer controller 701 through I/O 715 and is to provide chamber temperatures 717 to the dryer controller 701. Through the I/O 715, the dryer controller sends a pull speed setpoint 718 to a robot controller 720. I/O 715 may further interface with other dryer subsystems, such as a heater controller, liquid level controller, hood door controller (not depicted). Based on the pull speed setpoint 718, the robot controller 720 sends a motor command 722 to a robot motor 730. The robot controller 720 controls the robot motor 730 to the pull speed setpoint 718 based on motor position and/or motor speed feedback received from the robot position sensor 735.

In the foregoing specification, embodiments of the invention have been described with reference to specific exemplary features thereof. It will, however, be evident that various modifications and changes may be made thereto without departing from the broader spirit and scope of the invention as set forth in the appended claims. The specification and figures are, accordingly, to be regarded in an illustrative rather than a restrictive sense.

What is claimed is:

1. A method for drying a workpiece, comprising:
submerging the workpiece in a liquid volume; and
displacing the workpiece from the liquid volume to a gaseous volume at a pull speed that is dependent on the temperature of the gaseous volume,
wherein the pull speed is a non-linear function of the displacement of the workpiece, and
wherein the workpiece has an annular disk shape having an inner diameter surface and an outer diameter surface and wherein displacing the workpiece from the liquid further comprises:

displacing the workpiece at a first intermediate pull speed, greater than the initial pull speed, until a to of the inner diameter surface of the workpiece is submerged just below the interface; and displacing the workpiece at a second intermediate pull speed, less than the first intermediate pull speed, until approximately one half of the inner diameter surface of the workpiece is free of the liquid volume upon which the pull speed is increased from the second intermediate pull speed to a third intermediate pull speed.

2. The method as in claim 1, wherein displacing the workpiece from the liquid volume further comprises:
determining a temperature of the gaseous volume proximate to an interface between the liquid and gaseous volumes; and
setting the pull speed based on the determined temperature to be slower with lower temperature.

3. The method as in claim 2, wherein determining the temperature of the gaseous volume comprises measuring the temperature at a location within the gaseous volume that is no more than 50 mm from the interface.

4. The method as in claim 2, wherein the temperature of the gaseous volume is determined after the workpiece is submerged in the liquid volume and wherein the pull speed set to vary with displacement across a plurality of zones, the pull speed at each zone dependent on the temperature determination.

5. The method as in claim 1, wherein a top surface of the workpiece passes through an interface between the liquid and gaseous volumes at an initial pull speed and wherein a bottom surface of the workpiece passes through the interface at a final pull speed, different than the initial pull speed.

6. The method as in claim 1, wherein at least the initial pull speed and first intermediate pull speed are set by an automated control system comprising an input based on the temperature of the gaseous volume.

7. The method as in claim 6, wherein the second and third intermediate pull speeds and final pull speed are set by an automated control system comprising an input based on the temperature of the gaseous volume.

8. The method as in claim 1, wherein the third intermediate pull speed is greater than first intermediate pull speed.

9. The method as in claim 1, wherein the third intermediate pull speed is greater than both the initial pull speed and final pull speed.

10. The method as in claim 1, further comprising:
heating the gaseous volume while the workpiece is submerged in the liquid volume to raise the gaseous volume temperature from a first temperature and wherein displacement of the workpiece from the liquid volume commences upon the gaseous volume reaching a threshold temperature.

11. A method for drying a workpiece, comprising:
submerging the workpiece in a liquid volume, wherein the workpiece has a top surface, a bottom surface and an intermediate portion there between; and
displacing the workpiece from the liquid volume to a gaseous volume, wherein the bottom surface passes through an interface between the liquid and gaseous volumes at a final pull speed that is faster than a pull speed at which the intermediate portion passes through the interface.

12. The method as in claim 11, wherein displacing the workpiece from the liquid further comprises:
determining a temperature of the gaseous volume; and
setting an initial pull speed based on the determined temperature.

13. The method as in claim 12, wherein determining the temperature of the gaseous volume comprises measuring the temperature at a location within the gaseous volume that is no more than 50 mm from the interface.

14. The method as in claim 13, wherein the initial pull speed is no faster than the final pull speed.

15. The method as in claim 14, wherein the workpiece has an annular disk shape having an inner diameter surface and an outer diameter surface and wherein displacing the intermediate portion of the workpiece further comprises:
displacing the workpiece at a first intermediate pull speed, greater than the initial pull speed, until a top of the inner diameter surface of the workpiece is submerged just below the interface; and
displacing the workpiece at a second intermediate pull speed, less than the first intermediate pull speed, until approximately one half of the inner diameter surface of the workpiece is free of the liquid volume upon which the pull speed is increased from the second intermediate pull speed to a third intermediate pull speed until the pull speed is reduce to the final pull speed, wherein the final pull speed is faster than the second intermediate pull speed.

16. The method as in claim 15, wherein the third intermediate pull speed is greater than both the initial pull speed and final pull speed.

17. The method as in claim 15, wherein at least the initial pull speed and first intermediate pull speed are set by an automated control system comprising an input based on the temperature of the gaseous volume.

18. The method as in claim 17, wherein the second and third intermediate pull speeds and final pull speed are set by an automated control system comprising an input based on the temperature of the gaseous volume.

* * * * *